(12) United States Patent
Gianola et al.

(10) Patent No.: US 7,859,247 B2
(45) Date of Patent: Dec. 28, 2010

(54) DEVICE, SYSTEM AND METHOD FOR MONITORING ELECTROMAGNETIC FIELDS

(75) Inventors: Paolo Gianola, Turin (IT); Vincenzo Gigliotti, Turin (IT); Valter Squizzato, Turin (IT)

(73) Assignee: Telecom Italia S.p.A., Milan (IT)

( * ) Notice: Subject to any disclaimer, the term of this patent is extended or adjusted under 35 U.S.C. 154(b) by 50 days.

(21) Appl. No.: 10/550,455

(22) PCT Filed: Mar. 26, 2003

(86) PCT No.: PCT/EP03/03153

§ 371 (c)(1), (2), (4) Date: Sep. 26, 2005

(87) PCT Pub. No.: WO2004/086066

PCT Pub. Date: Oct. 7, 2004

(65) Prior Publication Data

US 2006/0226855 A1    Oct. 12, 2006

(51) Int. Cl.
G01R 31/28 (2006.01)
G01R 19/00 (2006.01)
H04B 17/00 (2006.01)

(52) U.S. Cl. .............. 324/158.1; 324/76.11; 455/115.3

(58) Field of Classification Search .............. 324/158.1, 324/76.11; 455/115.3
See application file for complete search history.

(56) References Cited

U.S. PATENT DOCUMENTS

| | | | |
|---|---|---|---|
| 4,823,280 A | 4/1989 | Mailandt et al. | |
| 4,890,332 A | 12/1989 | Takahashi | |
| 5,678,208 A | 10/1997 | Kowalewski et al. | |
| 5,756,967 A * | 5/1998 | Quinn et al. | 219/130.21 |
| 6,421,332 B1 | 7/2002 | Son | |
| 6,834,182 B2 * | 12/2004 | Fu | 455/115.1 |
| 6,954,620 B2 * | 10/2005 | Rotta et al. | 455/115.1 |

(Continued)

FOREIGN PATENT DOCUMENTS

EP    1 233 273 A    8/2002

(Continued)

OTHER PUBLICATIONS

"Communication pursuant to Article 94(3) EPC," issued by the European Patent Office for Application No. 03 720 370, dated Jul. 2, 2010 (7 pages).

(Continued)

Primary Examiner—Amy He
(74) Attorney, Agent, or Firm—Finnegan, Henderson, Farabow, Garrett & Dunner, L.L.P.

(57) ABSTRACT

A system for monitoring the electromagnetic field strength received at a predetermined point of a monitored area, includes a device that senses the electromagnetic field fed in at a least one frequency band to an antenna by a transmission apparatus and transmits at least one RF power signal indicative of electromagnetic field strength to a control center. With the control center a geographic data base is available that includes information items on the mutual position of the antenna and the predetermined point. A processing facility with the control center is configured for receiving the RF power signal from the device and calculating from the RF power signal and the data base items the field strength received at said predetermined point from the antenna.

19 Claims, 6 Drawing Sheets

U.S. PATENT DOCUMENTS

| | | | |
|---|---|---|---|
| 6,961,368 B2 * | 11/2005 | Dent et al. ................... | 375/219 |
| 2003/0114127 A1 * | 6/2003 | Baldwin ................... | 455/245.1 |
| 2004/0198232 A1 * | 10/2004 | Fu ........................... | 455/67.11 |

FOREIGN PATENT DOCUMENTS

| | | |
|---|---|---|
| EP | 1 233 273 A2 | 8/2002 |
| KR | 2002-0054518 | 7/2010 |
| WO | WO 95/03549 | 2/1995 |
| WO | WO 95/03549 A | 2/1995 |
| WO | WO 02/095428 A1 | 11/2002 |

OTHER PUBLICATIONS

Database WPI; Week 200303; Thomson Scientific, London, GB; AN 2003-036962 and KR 2002 0054518A (LG Electronics Inc), Jul. 8, 2002 (1 page).

* cited by examiner

DEVICE, SYSTEM AND METHOD FOR MONITORING ELECTROMAGNETIC FIELDS

FIELD OF THE INVENTION

The present invention relates to techniques for monitoring electromagnetic fields and was developed by paying specific attention to the possible application to monitoring the level or strength of ambient electromagnetic fields.

DESCRIPTION OF THE RELATED ART

In EP-A-1 233 273, a device for monitoring electromagnetic fields is disclosed comprising a reception chain capable of generating at least one signal that is indicative of the electromagnetic field strength measured by an antenna element. A threshold comparator element compares the field strength signal with a predetermined threshold. The threshold level of the threshold comparator is selectively variable. A selector element renders the device selectively sensitive to the electromagnetic field in at least two different frequency bands. A communication interface is also provided so that data can be transmitted to and/or from the device thus permitting e.g. the selected band and/or the threshold level used for monitoring to be varied selectively from a remote station.

Such a prior art device is intended to meet the growing concern about exposure to electromagnetic fields especially in connection with sources such as:

radio and/or television transmitters (which, in urban areas with large concentrations of broadcasters are among the most significant sources of electromagnetic pollution), and communication system transmitters, e.g., for mobile telephony.

Regulations are being adopted in a number of countries—such as for instances the so-called ICNIRP Guidelines for limiting exposure to time-varying electric, magnetic, and electromagnetic fields (up to 300 GHz)—that set a limit e.g. to the transit power over a defined time interval (for instance 6 minutes).

OBJECT AND SUMMARY OF THE INVENTION

The object of the invention is to further improve prior art electromagnetic field monitoring arrangements. This permits notional real-time control of electromagnetic field intensity, by paying specific attention to the possibility of devising integrated systems adapted to permit proper electromagnetic field power management over a given area.

Moreover, object of present invention is a device, system and method directed at ensuring that established maximum levels are not exceeded and/or that at any point in the area under control the field level is satisfactory for providing the expected quality of service.

According to the present invention, such an object is achieved by means of a device having the features set forth in the claims that follows. The invention also relates to a related system and method.

In a possible preferred embodiment, the device of the invention acts as a sort of electromagnetic "fuse" adapted to reduce the power emission or de-activate an electromagnetic field source (such as a base station in a mobile telecommunications and/or broadcast network) if the electromagnetic field is found to exceed a predetermined maximum level.

Advantageously, the device of the invention can be used as a power meter adapted for sending to a control centre the results of RF power measurements, possibly in the form of average measurements over given time intervals. In addition to the proper measurement circuitry, a RF power meter device according to the invention preferably includes a microprocessor and a communication interface such as a GSM modem which transmits such data to a remote control centre. This may occur via a suitable syntax through a SMS messaging system over a mobile telephone network.

The control centre is in turn able to similarly communicate with the device. The results received at the control centre are stored and managed automatically.

BRIEF DESCRIPTION OF THE DRAWINGS

The invention will now be described, by way of example only, with reference to the annexed figures of drawing, wherein.

DETAILED DESCRIPTION OF THE PREFERRED EMBODIMENTS OF THE INVENTION

Figure 1:
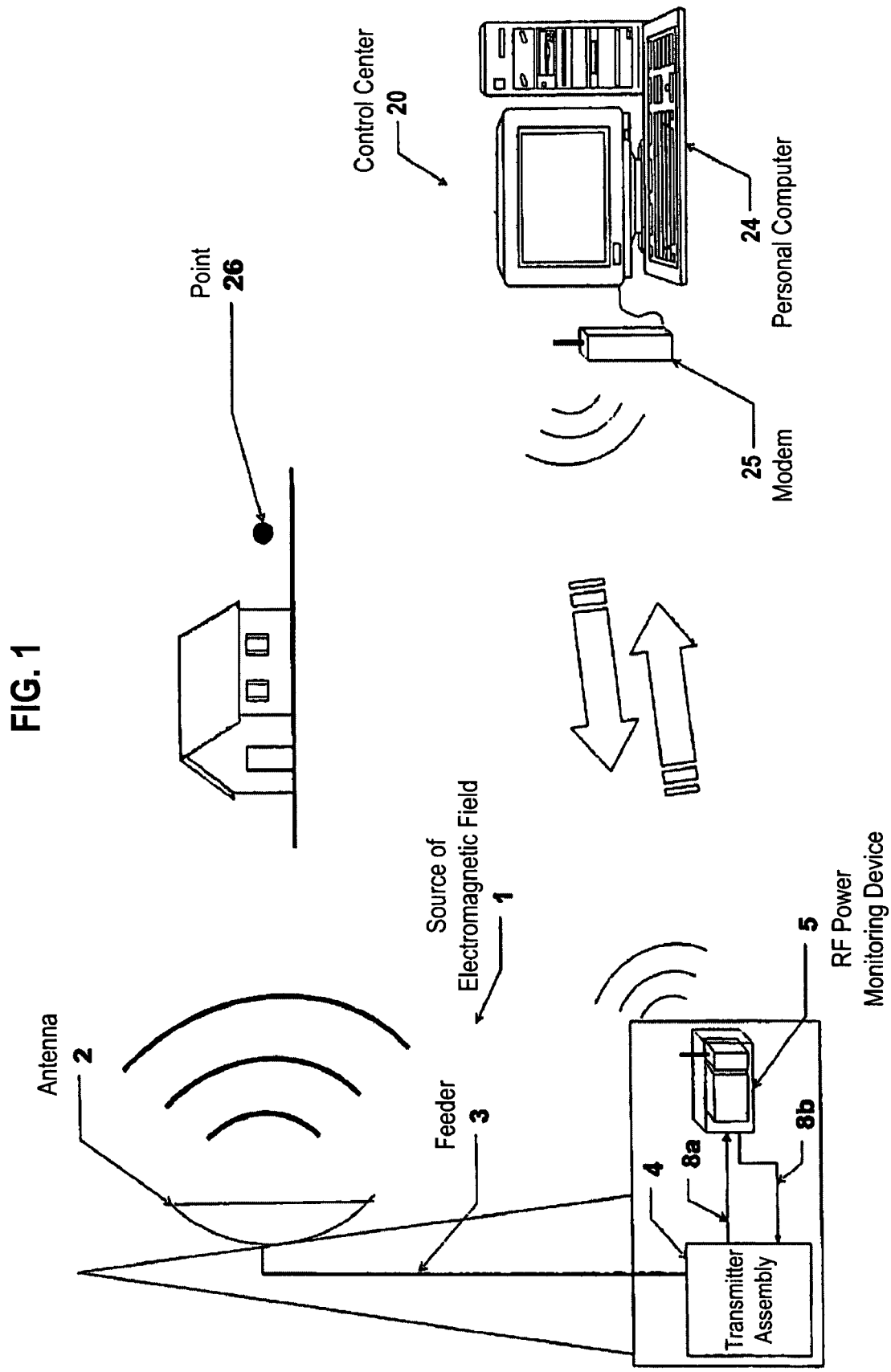
FIG. 1 is a schematic representation of the general arrangement of an electromagnetic field monitoring system)

In FIG. 1, reference 1 generally designates a source of electromagnetic field such as, e.g. a base station (BTS) included in a mobile telecommunications system or a broadband transmitter.

Reference to a base station such as a BTS station is of exemplary nature only and must in no way be construed as limiting scope of the present invention, which is in fact adapted for use in connection with any source of electromagnetic fields, in particular for telecommunications.

More in detail, the station 1 includes one or more antennas 2 fed with a RF signal over a feeder 3 from a transmitter assembly 4 of a known type having associated a RF power monitoring device 5.

Figure 2:
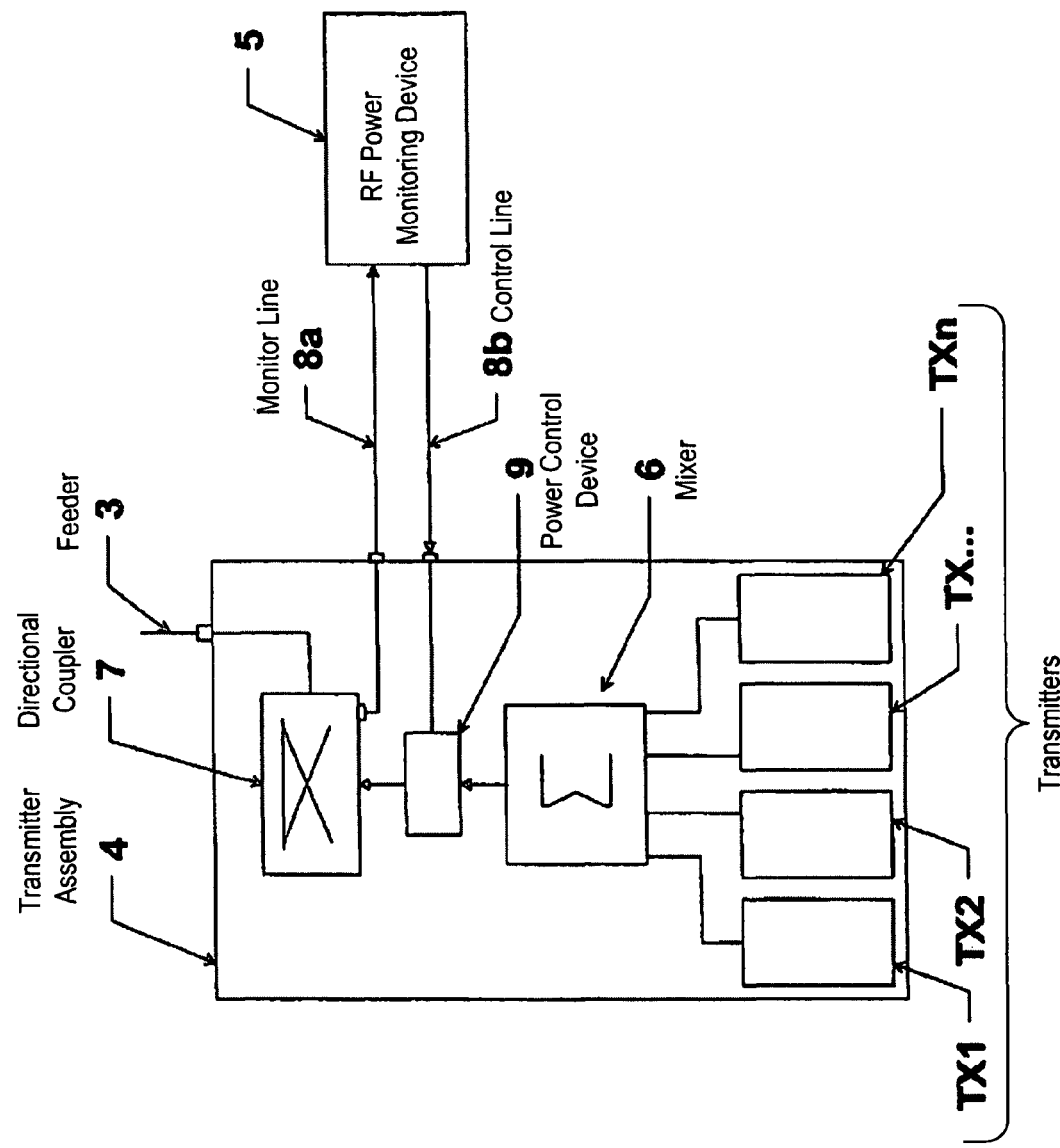
FIG. 2 is a block diagram showing a RF power monitoring device as associated to an electromagnetic field source such as a base station in a mobile telecommunications system.

As shown in FIG. 2, the transmitter assembly 4 includes a number of transmitters TX1, TX2, TX3 . . . , TXn each transmitting over a respective frequency band. The output signals from the various transmitters in question are combined in a mixer 6 to be transferred to the antenna (s) via the feeder 3. This usually occurs via a directional coupler 7 from which a monitor line 8a is derived.

On the monitor line 8a signals are present (typically in the form of low-level RF signals) whose intensities are a function—usually proportional—of the intensities of the RF signals sent towards the antenna (s) 2 in the various frequency bands concerned.

By knowing other parameters of the station 1, such as the power loss along the feeder 3 as well as cartographic information of a site, the signals on the monitoring line 8a are thus indicative of the strength of the electromagnetic fields transmitted from the antenna (s) 2 in each and every band covered by the transmitters TX1, TX2, TX3 . . . , TXn.

In other words, the RF power measurements are indicative of the electromagnetic field in the geographic area covered by the antenna (2).

The control line 8b connects the monitoring device 5 to the power control device 9 of the BTS. The BTS could decrease or even shutdown the signal injected in the antenna under commands sent, for example, from the monitoring device 5.

According to further embodiments of present invention, the device 5 can be associated either to a plurality of antennas or to a plurality of base stations or broadband transmitters.

Moreover, the device 5 can be integrated or associated, in known way, either into/to the antenna 2 or into/to the transmitter assembly 4.

Figure 3:
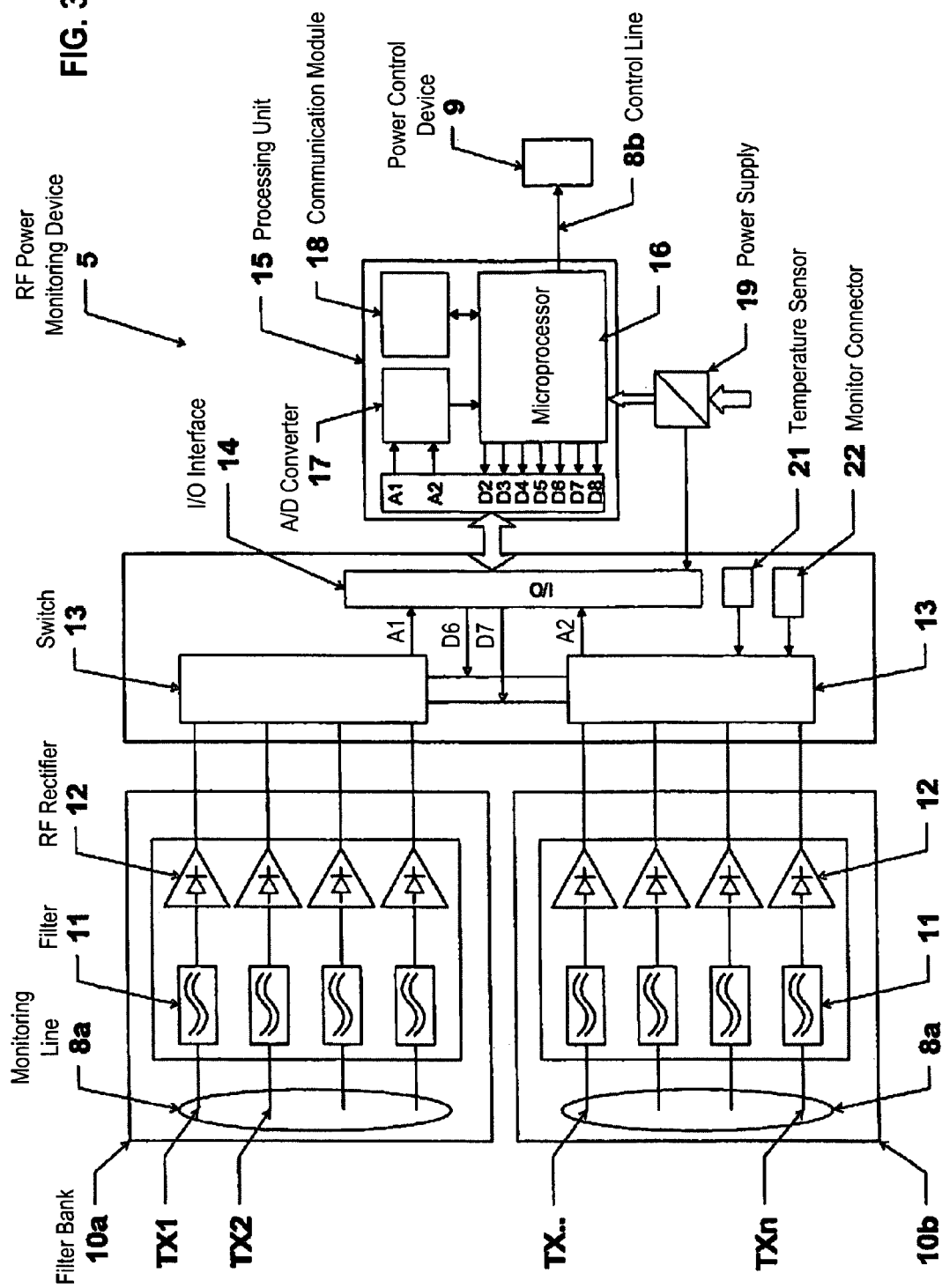
FIG. 3 is block diagram of the RF power monitoring device shown in FIG. 2.

By referring now to the block diagram of FIG. 3, the signals over the monitoring line 8a are sent towards one or more filters banks 10a, 10b each including a number of input channels for receiving the monitoring signals from the transmitter 4.

Two banks of filters 10a, 10b being shown herein is due to the current availability of this arrangement as a standard component and must in no way be construed as limiting the scope of the invention.

Each input channel in the filter banks 10a, 10b is adapted for receiving RF signals, in the frequency band of one of the transmitters in the station 1. For that reason, in the block diagram of FIG. 3, those input channels are simply labelled with the same references TX1, TX2, TX3 . . . , TXn designating those transmitters.

Each input channel generally includes an (optional) filter 11 for performing a band pass filtering action to possibly dispense with interference from other channels as well as a RF rectifier 12. The rectifier 12, for example an AD8361 of ANALOG DEVICES, is cascaded to the filter 11 to produce an analogue DC signal whose value is proportional to the root mean squared (RMS) of the input signals; in other word the output DC signal is indicative of the global RF power in transit over the input channels TX1, TX2, TX3, TXn.

The output line from each RF rectifier 12 is brought to a corresponding switch 13 controlled by logic input signals D6, D7. Two such switches 13 are shown herein due to the filter banks 10a and 10b being arranged in parallel.

The (analogue) output signals A1, A2 selected by the switches 13 are fed to an input/output interface 14 adapted to interface the circuitry described in the foregoing with the processing unit 15 including a processing device such as a microprocessor 16.

Any of the rectified signals produced by the various RF rectifiers 12 may thus be caused to appear at the output of the interface 14.

Within the processing unit 15, reference 17 designates an analogue-to-digital converter for converting the analogue signals A1, A2 as received at the interface 14 into corresponding digital signals to be fed to the microprocessor 16 for processing.

The microprocessor 16 also includes a number of output control lines D3 to D8, including lines D6 and D7 that control the switches 13.

Reference 18 designates a communication module such as GSM modem for transmitting signals from/to the microprocessor 16 (and the device 5 at large).

Reference 19 designates the AC/DC power supply feeding the various circuits described in the foregoing.

Essentially, the microprocessor 16 controls the various logical gates in the device, senses and measures the values of the two monitoring signals A1, A2 possibly storing the respective values thereof in an associated memory (not shown, but of a known type) in order to process them and send the results to a remote control centre 20 (FIG. 1) via the communication module 18. As indicated, this is preferably configured as a GSM modem thus permitting communication to and from the remote control centre 20 to take place via SMS messaging.

The microprocessor controls also the control line 8b that communicates with the power control 9; this control line 8b is used by microprocessor 16 for controlling, in a way well known in the art and which is not necessary to be described herein, the decrease or shutdown of the RF power injected in the antenna 2 when precise conditions are met.

In particular, the microprocessor 16, by using a control module stored into the associated memory or commands received from the control centre 20, as will be described later on, is able to control the RF power injected into the antenna 2.

A presently preferred embodiment of the device 5 provides, for example, that the RF input power is converted into DC signals A1, A2; such DC signals A1, A2 are proportional to the RF power according to a predetermined ratio.

Therefore, the DC signals A1, A2, are proportional to the electromagnetic field intensity generated by the antenna 2 associated to the device 5.

Still preferably, the logic control signals D6, D7 to the switches 13 are generated in such a way that the output signals A1, A2 sequentially correspond to the various RF input signals to the filter banks 10a, 10b at the various frequencies.

In a preferred embodiment, the device 5 will also includes a temperature sensor 21 which is controlled together with the power supply 19 via microprocessor outputs D5, D6, D7. The output lines D3 and D4 are usually adapted to control display units (such as LEDs) that are adapted to be activated as a result of the measured field signal having reached a threshold. Reference 22 indicates a monitor connector.

Figure 4:
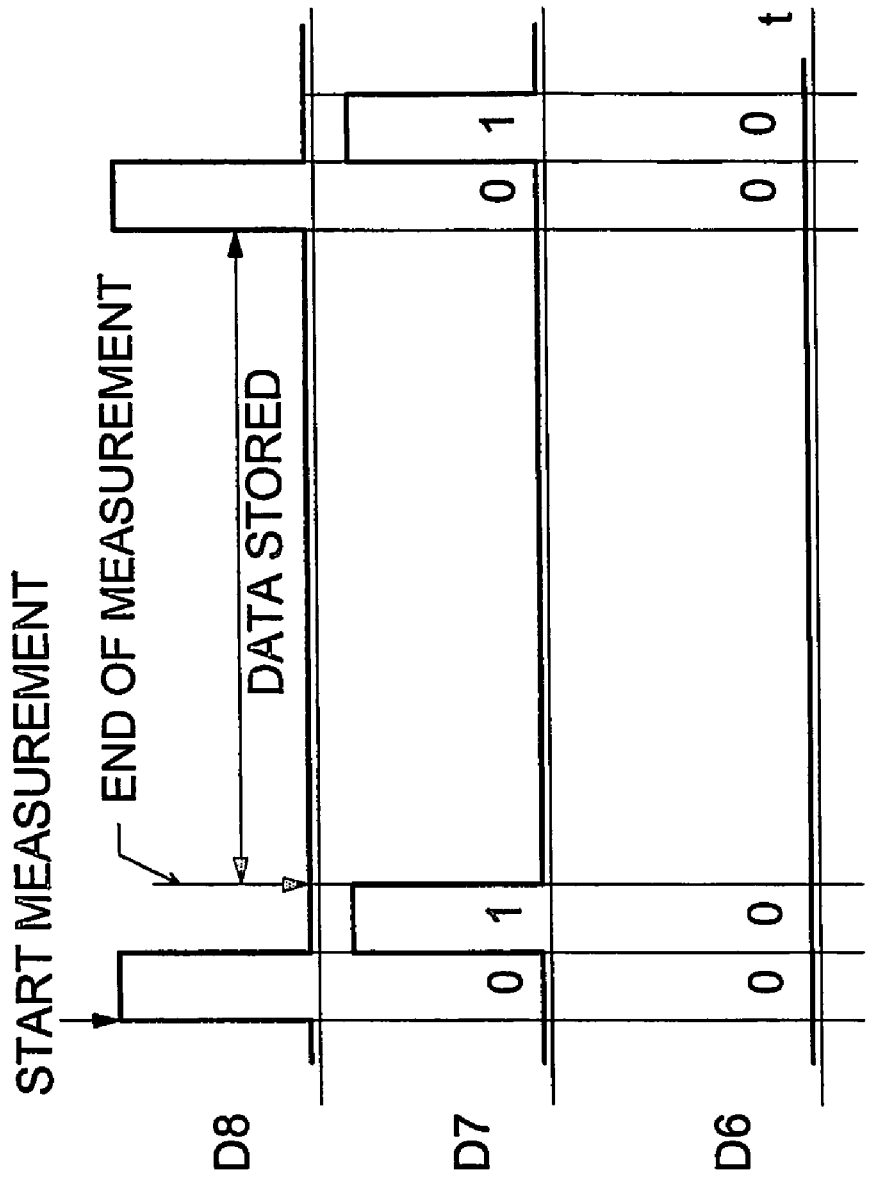
FIG. 4 is a time diagram showing RF power measurements carried out in the system described herein.

The graph of FIG. 4 shows a typical measurement cycle carried out by controlling the logical outputs D6 and D7 of the microprocessor 16 in order to acquire the voltage on the two analogue channels A1 and A2.

In the example shown (this is recalled to be just an example), sensing the voltage at the output of the interface 14 is carried out by initially setting the outputs D6 and D7 at reference values (e.g. the zero values) during the "active" portion of a cycle of the clock signal (exemplified by D8) and subsequently switching to "one" the D7 signal from the microprocessor 16.

The results thus obtained are memorized in the memory of the microprocessor 16. The sampling time is a significant parameter. It is in fact necessary to determine precisely the intervals required for performing the three phases (setting of the logical outputs, acquisition proper, storing the results) comprising the measurement cycle.

As shown in FIG. 4, most of the time within the cycle is devoted to storing the results, which may require e.g. 7 ms, while setting the logical outputs D6 and D7 and acquiring the DC voltage may require e.g. 244 microseconds.

In fact, in the presence of such a short sampling times, a sort of averaging action may be beneficial.

The typical sampling time as shown in FIG. 4 is about 10 ms and standards such as the ICNIRP standard referred to in the introductory portion of the description indicate a typical measurement time of 6 minutes. These values would at least notionally lead to 36,000 different samples being collected and stored for each transmitter TX1, TX2, TX3 . . . , TXn. Such a high number of samples would render storing the results unnecessary critical.

For that reason a preferred embodiment of the invention provides that the samples collected each 10 ms be averaged over a time interval of e.g. one second. The average values thus computed are then stored. In that way, in the case of the six minutes considered in the ICNIRP standard, for example, only 360 average values are stored, thus making managing of the memory in the microprocessor 16 much easier.

In the preferred embodiment, a number of averaged samples slightly less than 360, such as 354 are stored. This is due to the additional time for computing the average value which is approximately 17 ms at each second.

The average of these 354 samples of the RF power injected, for example, can be evaluated immediately with a power threshold value either memorized in the memory associated to the microprocessor 16 or received from the control centre 20; should they exceed the threshold value, the microprocessor 16 will operate the reduction or the shutdown of the power using the power control 9 via the control line 8b. In this case the device 5 acts as a local or remote "fuse" and will inform, by means of the communication module 18, the control centre 20 of this action.

The results stored in the memory associated with the microprocessor 16 are then sent to the control centre 20. This is preferably comprised of a personal computer 24 connected via an RS232 interface to a GSM terminal (modem) 25 adapted for communication with the GSM modem 18 provided in the device 5.

In operation of the system shown in FIG. 1, the control centre 20 periodically requests updated measurement data from the device 5. The request may be conveyed by a short message (SM) sent by the terminal 25 towards the device 5 and, more specifically, the modem 18.

The syntax of such a message preferably includes information concerning the time of day for starting and completing measurements, the RF inputs (TX1, TX2, TX3, or TXn) to be measured and so on.

Upon receiving the short message conveying the request, the device 5 sends to the control centre 20 another short message acknowledging receipt of the request. The device 5 subsequently carries out a measurement cycle along the lines described in the foregoing. The results are subsequently sent to the control centre 20 again in the form of one or more short messages.

In addition to sending the short message prompting each measurement cycle, the personal computer 24 ascertains the possible presence of new messages at the terminal 25 and, in the positive, stores them in view of subsequent processing. The possibility also exists of forwarding the short messages received from the device 5 towards another control centre, a given telephone number or a given e-mail address.

Figure 5:
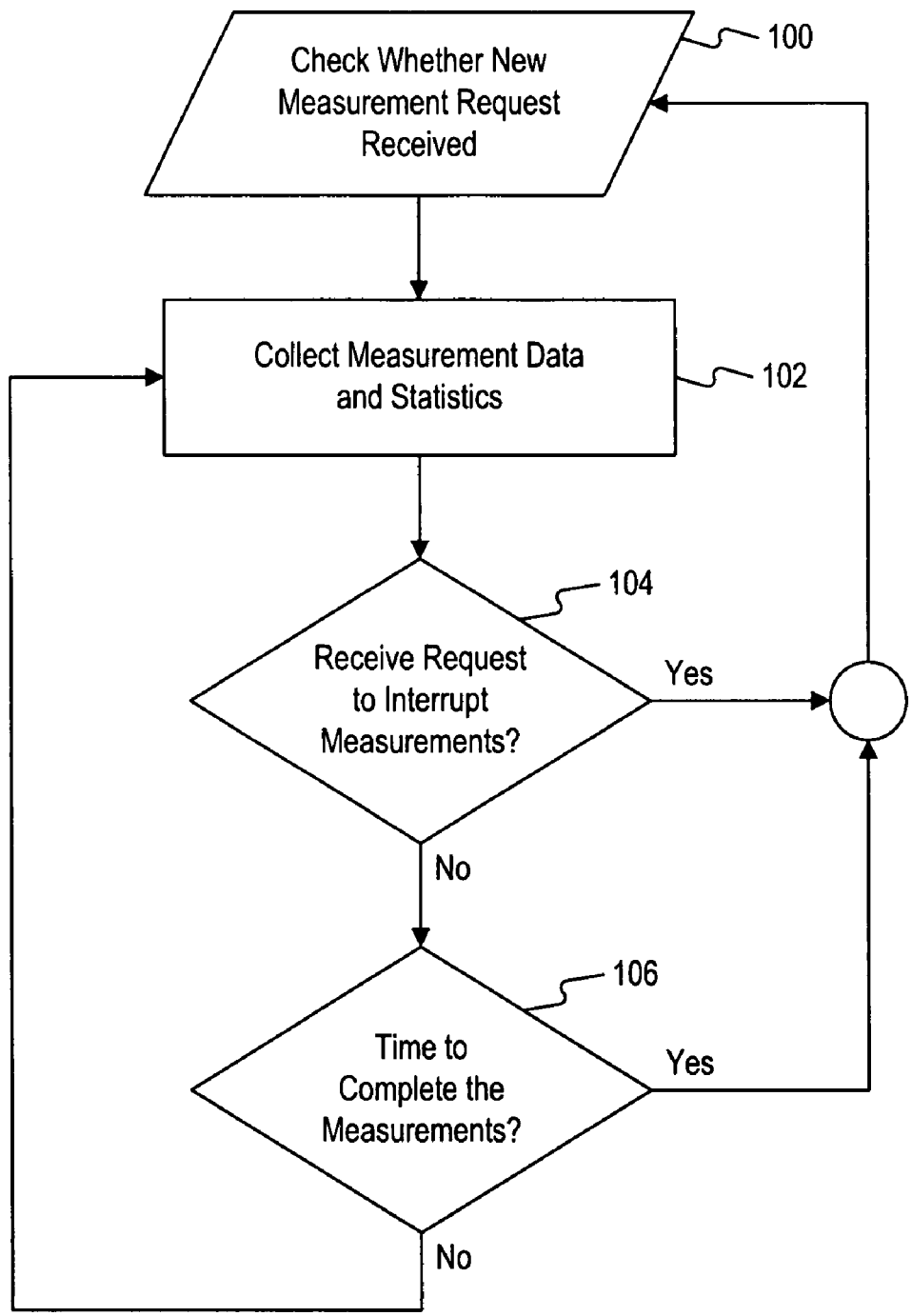
FIG. 5 is a flow chart further explaining how RF power measurements are performed.

The flow chart of FIG. 5 exemplifies in general terms operation of the device 5.

In a step 100, the device 5 periodically checks whether new requests are received from the control centre 20. This step is performed e.g. every twenty seconds.

Upon receiving such a message conveying a measurement request, the device 5 sends an acknowledgement message towards the centre 20 and then starts the measurement phase proper, which is designated 102 as a whole. During such a phase, the device 5 collects the measurement data and computes the average values thereof as explained in the foregoing while also sending the results towards the control centre 20 in the form of short messages. Preferably, the phase 102 involves computation of a moving average of the results sent, e.g. such a moving average being computed every minute in a total measurement interval of six minutes.

Intervals at which the results are sent towards the control centre can be selected in order to best exploit the communication facilities existing between the device 5 and the control centre 20. Consequently, those results can be sent at intervals of, e.g., 3, 4, 5, 10 minutes depending on the specific needs to be met.

In a step 104 the device 5 checks whether a message indicating that the measurements are to be interrupted has been received from the control centre 20. The device 5 is thus reset to the wait step 100 in the case of a positive result. In the negative, in a step 106, the device 5 further checks whether the final time for completing measurements, as indicated in the original message received from the control centre 20, have been reached. In the positive, the device 5 evolves back to the wait step 100. In the negative, operation of the device 5 further evolves to the measurement phase 102.

The personal computer 24 is configured in such a way to coordinate co-operation with one or more devices 5 associated with respective sources of electromagnetic fields such as base station, transmitters, and so on.

Essentially, the personal computer 24 performs the following functions:

selecting and setting the serial gate connected to the GSM terminal 25, sending single commands for co-operating with the terminal 25, sending short messages, automatically receiving short messages, storing (e.g. on hard disk) the results received from the device(s) 5, and displaying the results received.

The computer 24 may also include one or more databases containing information on the various devices 5 (anagraphic information, respective SIM numbers of the GSM modems associated therewith and so on).

In a particularly preferred embodiment of the invention, such databases may include specific information concerning the or each antenna 2 such as e.g. the attenuation values of the feeders 3 and the circuits associated therewith (directional coupler 7 and so on).

Based on this information, and the measurement data received from the device 5, the personal computer 24 is thus in a position to compute the field strength emitted at a given time (or over a given period of time—as indicated, this may be in the form of the average value over a given time interval of e.g. 6 minutes) by the or each antenna 2 monitored, possibly for each and every frequency band covered by the transmitters TX1, TX2, TX . . . , TXn.

The availability of additional geographical information concerning the location of the antenna 2 and specific propagation characteristics associated thereto within a certain area being monitored also permits the expected field strength at any given point of that area to be evaluated.

Figure 6:
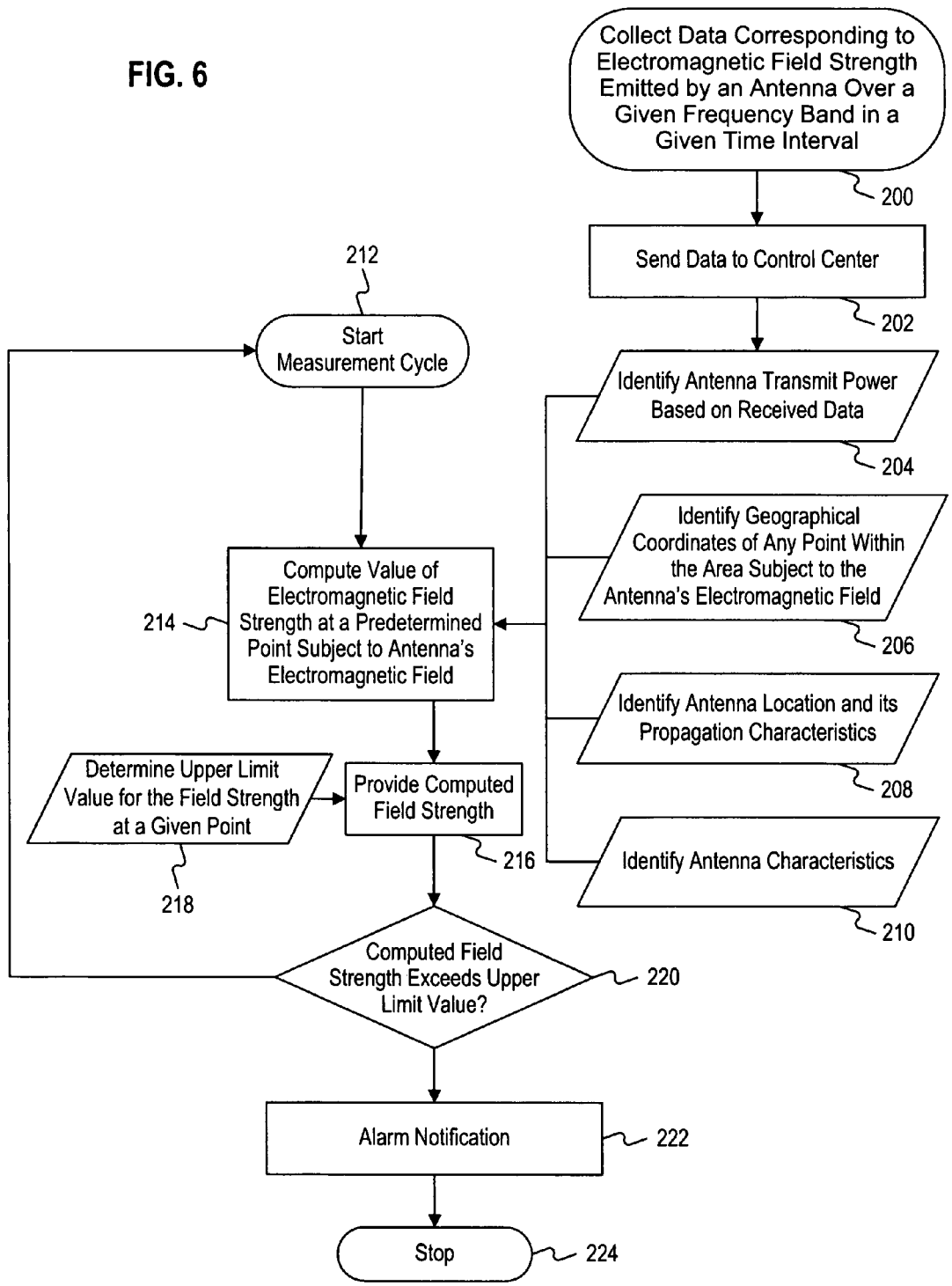
FIG. 6 is the flow chart which details the complete procedure to evaluate the electromagnetic field.

In the flow chart of FIG. 6, reference 200 designates the step where the (or each) device 5 connected to a given control centre 20 collects data corresponding to the electromagnetic field strength emitted by a respective antenna 2 over a given frequency band at a given instance of time (e.g. over a given time interval).

In a step 202, these results are sent from the or each device 5 to the control centre 20 as a value of the transit power 204 at the respective antenna.

These data are adapted to be processed jointly with other data items available at the control centre 20. These additional data items typically include:

the geographical coordinates (as derived from a data base designated 206) of any point within the area subject to monitoring where the electromagnetic field strength is to be evaluated, a cartographic data base (designated 208) containing information concerning the location of the or any antenna 2 within the area subject to monitoring and specific propagation characteristics associated thereto within a certain area, and another data base designated 210 grouping records concerning the characteristics of the antenna(s) 2 such as the attenuation values of the feeders 3 and the circuits associated therewith.

More specifically, the cartographic data base 208 includes information in a raster and/or vector format concerning the terrain and buildings within the area subject to monitoring.

The antenna data base 210 generally includes information concerning:

the geographic coordinates and altitudes of the antennas, the aiming direction (azimuth, elevation), the antenna gain, the radiation diagrams in the main planes (vertical, horizontal), the maximum RF output power from the base station towards the antenna, the loss figures of the cables/waveguides between the base station and the antenna (feeder).

The antenna data base 210 shall also include the attenuation value relating the power output from the base station towards the antenna to the power output from the base station towards the measuring device.

Following a step 212 marking the start of the measurement cycle, in a processing step 214 the computer 24 computes (in a manner known per se) the value of field strength present at any point 26 (FIG. 1, FIG. 6)) identified by the coordinates taken from the data base 206 as a function of the power level detected by each device 5.

In fact, the power level(s) detected by the device(s) 5 in a given frequency band can be directly related—on the basis of the information stored in the data base 210—to the electromagnetic field emitted by the or each antenna 2 in a given frequency band.

Since the position of the or each antenna is known (as recorded in the geographic data base 208) and the coordinates of the point at which the field strength to is be evaluated are similarly known (as recorded in the data base 206), the field strength in question can be computed on the basis of propagation calculations thus leading to corresponding field strength value to be made available in a step 216. Advantageously, the method disclosed in WO-A-02/095428 can be used for that purpose. The system may be extended to include a plurality of devices 5 associated with antennas 2 of a respective plurality of antennas which jointly "cover" a given area. The devices 5 thus provide respective RF power signals to the control centre 20. The personal computer 24 is configured for calculating, from the RF power signals received from the various devices 5 and the information items in the geographic data base 206, 208, the electromagnetic field strength at any point 26 of the area covered, such electromagnetic field resulting from the superposition of the electromagnetic fields emitted by the various antennas.

In any case, the accuracy of the value determined in the step 216 may be checked by way of direct comparison with the field strength possibly measured "on the field" by means of a device as disclosed in EP-A-1 233 273, the results of such a comparison being selectively available for different frequency bands/ranges. The precision of the values provided by the system just described may thus be measured and the computational tools used in the computer 24 correspondingly refined.

An upper limit value for the field strength at a given point of the area monitored, as read in a step 218, may thus be compared in a step 220 with the value calculated during the processing step 212.

The upper limit in question may identify an upper limit (for instance 20 V/m) as a maximum value not to be exceeded at any time at any point in the area under control of course, such a comparison can be carried out selectively by distinctly referring to a given upper limit for each frequency band in which the field strength is evaluated.

In the case the upper limit in question is not exceeded (negative outcome of the comparison step 220) operation of the computer 24 simply loops back to the start step 214.

Alternatively, if the comparison 220 shows that the upper limit in question is reached, operation of the computer 24 evolves to an alarm phase 222 which may lead to a number of interventions such as, e.g.:

an alarm signal is sent to the operator and/or a control centre of the system to which the antenna (s) responsible for the unduly high field strength belongs, a control signal is sent to the device 5 associated with the antenna in question, causing the device 5 to act as a remote "fuse" in order to reduce the electromagnetic field emitted within a given frequency band from one or more of antennas towards the point where the field strength is evaluated; such an intervention of device 5, which may even lead to the corresponding transmitter 4 to be shutdown, is carried out according to the method already described before. Advantageously, the control signal in question can be sent from the control centre 20 to the or each device 5 by exploiting the same link (for instance GSM short message signalling) adopted for sending to the device 5 the messages ordering measurement processes to be started and for collecting field strength data from the device.

After this, operation of the computer 24 evolves to a stop step designated 224.

In a complementary manner to what has been just described, the remote field strength monitoring arrangement just described may be operated with the purpose of ensuring that the field strength at any point of the area under control reaches a minimum level required to ensure a given quality of service, with the additional possibility of selectively increasing (through the device 5 associated therewith) the power emitted from one or more antennas in order to ensure proper field coverage of the whole area.

Of course, without prejudice to the underlying principles of the invention, the details and embodiments may vary, also significantly, with respect to those that have been described and shown herein just by way of example, without departing from the scope of the invention as defined by the annexed claims.

The invention claimed is:

1. A device for monitoring the electromagnetic field emitted by an antenna, the device comprising:

a measurement arrangement for measuring at least one RF power signal input to the antenna in at least one frequency band, wherein said at least one RF power signal is indicative of the electromagnetic field strength emitted by the antenna over a given area;

a communication module for transmitting said at least one RF power signal measurement to a remote processing facility, wherein the communication module is configured to receive a power control command from the remote processing facility, wherein the power control command is based on at least cartographic information about the given area; and a control module configured to control, in response to the power control command received from the remote processing facility, an intensity of the at least one RF power signal input to the antenna.

2. The device of claim 1, wherein said measurement arrangement comprises a sampling circuit responsive to the at least one RF power signal input to the antenna, the sampling circuit generating a sequence of samples indicative of the electromagnetic field strength over a given time interval.

3. The device of claim 2, wherein:
said sampling circuit generates a first set of samples indicative of the electromagnetic field strength over a given time interval,
said measurement arrangement comprises an average calculating circuit to generate a signal indicative of the average electromagnetic field strength over a given time interval, and
said average calculating circuit is configured for averaging sub sets of said first set of samples so as to generate a second set of averaged samples, said second set of averaged samples comprising a number of samples that is smaller than the number of samples comprised in said first set of samples.

4. The device of claim 3, wherein the device further comprises a memory for storing data representative of said at least one RF power signal, said memory being arranged to store at least said second set of samples.

5. The device of claim 1, wherein said measurement arrangement comprises an average calculating circuit to generate signals indicative of the average electromagnetic field strength over a given time interval.

6. The device of claim 1, wherein the device further comprises a memory for storing data representative of said at least one RF power signal.

7. The device of claim 1, wherein said measurement arrangement comprises a plurality of measuring channels, each measuring channel for measuring RF power signals input to said antenna in a respective frequency band.

8. The device of claim 7, wherein the device further comprises at least one switch for selectively feeding towards said communication module the output signal of any of said measuring channels, whereby RF power signals respectively indicative of electromagnetic field strengths emitted by said antenna for each of said frequency bands are adapted to be transmitted from the device.

9. The device of claim 1, wherein the communication module transmits said at least one RF power signal to the remote processing facility using a wireless communication protocol.

10. The device of claim 1, wherein the antenna is positioned at a fixed location.

11. The device of claim 10, wherein the measurement arrangement measures at least one RF power signal input to a plurality of antennas positioned at the fixed location.

12. A transmission apparatus comprising a device for monitoring an electromagnetic field emitted by a antenna, the transmission apparatus emitting at least one RF power signal to the antenna, the device comprising:

a measurement arrangement for measuring the at least one RF power signal input to the antenna in at least one frequency band, wherein said at least one RF power signal is indicative of the electromagnetic field strength emitted by the antenna over a given area;
a communication module for transmitting said at least one RF power signal measurement to a remote processing facility, wherein the communication module is configured to receive a power control command from the remote processing facility, wherein the power control command is based on at least cartographic information about the given area; and
a control module configured to control, in response to the power control command received from the remote processing facility, an intensity of the at least one RF power signal input to the antenna.

13. The transmission apparatus of claim 12, wherein the communication module transmits said at least one RF power signal to the remote processing facility using a wireless communication protocol.

14. The transmission apparatus of claim 12, wherein the antenna is positioned at a fixed location.

15. The transmission apparatus of claim 14, wherein the measurement arrangement measures at least one RF power signal input to a plurality of antennas positioned at the fixed location.

16. An antenna comprising a device for monitoring an electromagnetic field emitted by the antenna, the device comprising:

a measurement arrangement for measuring at least one RF power signal input to the antenna in at least one frequency band, wherein said at least one RF power signal is indicative of the electromagnetic field strength emitted by the antenna over a given area
a communication module for transmitting said at least one RF power signal measurement to a remote processing facility, wherein the communication module is configured to receive a power control command from the remote processing facility, wherein the power control command is based on at least cartographic information about the given area; and
a control module configured to control, in response to the power control command received from the remote processing facility, an intensity of the at least one RF power signal input to the antenna.

17. The antenna of claim 16, wherein the communication module transmits said at least one RF power signal to the remote processing facility using a wireless communication protocol.

18. The antenna of claim 16, wherein the antenna is positioned at a fixed location.

19. The antenna of claim 18, wherein the measurement arrangement measures at least one RF power signal input to a plurality of antennas positioned at the fixed location.

* * * * *